(12) United States Patent
Yin et al.

(10) Patent No.: US 9,865,686 B2
(45) Date of Patent: Jan. 9, 2018

(54) SEMICONDUCTOR DEVICE AND MANUFACTURING METHOD THEREFOR

(71) Applicant: Institute of Microelectronics, Chinese Academy of Sciences, Beijing (CN)

(72) Inventors: Huaxiang Yin, Beijing (CN); Huilong Zhu, Poughkeepsie, NY (US); Xiaolong Ma, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/646,583

(22) PCT Filed: Aug. 12, 2013

(86) PCT No.: PCT/CN2013/081273
§ 371 (c)(1),
(2) Date: May 21, 2015

(87) PCT Pub. No.: WO2014/079234
PCT Pub. Date: May 30, 2014

(65) Prior Publication Data
US 2015/0318354 A1    Nov. 5, 2015

(30) Foreign Application Priority Data
Nov. 25, 2012    (CN) .......................... 2012 1 0483608

(51) Int. Cl.
*H01L 29/10*     (2006.01)
*H01L 29/78*     (2006.01)
(Continued)

(52) U.S. Cl.
CPC .... *H01L 29/1054* (2013.01); *H01L 21/28008* (2013.01); *H01L 21/308* (2013.01); *H01L 21/30604* (2013.01); *H01L 29/16* (2013.01);

*H01L 29/161* (2013.01); *H01L 29/20* (2013.01); *H01L 29/401* (2013.01); *H01L 29/41783* (2013.01); *H01L 29/66553* (2013.01); *H01L 29/66795* (2013.01); *H01L 29/785* (2013.01);
(Continued)

(58) Field of Classification Search
CPC ............. H01L 29/7856; H01L 29/1054; H01L 29/66795; H01L 29/7855; H01L 29/785
See application file for complete search history.

(56) References Cited

U.S. PATENT DOCUMENTS 7,799,592 B2 *   9/2010   Lochtefeld ........ H01L 29/66795
                                                     257/185
2005/0051825 A1   3/2005   Fujiwara et al.
(Continued)

FOREIGN PATENT DOCUMENTS

CN    101140949 A    3/2008
CN    102668093 A    9/2012

OTHER PUBLICATIONS

International Search Report issued in PCT/CN2013/081273 dated Nov. 21, 2013 (2 pages).

*Primary Examiner* — Mark Tornow
(74) *Attorney, Agent, or Firm* — Osha Liang LLP

(57) ABSTRACT

A semiconductor device includes a fin extending on a substrate along a first direction; a gate extending along a second direction across the fin; and source/drain regions and a gate spacer on the fin at opposite sides of the gate, in which there is a surface layer on the top and/or sidewalls of the fin.

15 Claims, 6 Drawing Sheets

(51) Int. Cl.
*H01L 29/417* (2006.01)
*H01L 29/66* (2006.01)
*H01L 29/40* (2006.01)
*H01L 21/306* (2006.01)
*H01L 21/308* (2006.01)
*H01L 29/16* (2006.01)
*H01L 29/161* (2006.01)
*H01L 29/20* (2006.01)
*H01L 21/28* (2006.01)
H01L 29/267 (2006.01)
H01L 29/165 (2006.01)

(52) U.S. Cl.
CPC ........ *H01L 29/7851* (2013.01); *H01L 29/165* (2013.01); *H01L 29/267* (2013.01); *H01L 29/66545* (2013.01)

(56) References Cited

U.S. PATENT DOCUMENTS

| | | | |
|---|---|---|---|
| 2008/0048262 A1* | 2/2008 | Lee | H01L 29/41791 257/347 |
| 2013/0183804 A1* | 7/2013 | Wang | H01L 29/66803 438/285 |
| 2013/0234204 A1* | 9/2013 | Kang | H01L 29/7851 257/190 |

* cited by examiner

SEMICONDUCTOR DEVICE AND MANUFACTURING METHOD THEREFOR

CROSS-REFERENCE TO RELATED APPLICATION(S)

This application is a U.S. national phase application of PCT Application No. PCT/CN2013/081273, filed on Aug. 12, 2013, entitled "SEMICONDUCTOR DEVICE AND MANUFACTURING METHOD THEREFOR," which claims priority to Chinese Application No. 201210483608.5, filed on Nov. 25, 2012. This application claims the benefit and priority of these prior applications and incorporates their disclosures by reference in their entireties.

TECHNICAL FIELD

The present disclosure relates to a semiconductor device and a method for manufacturing the same, and particularly, to a three-dimensional (3D) multi-gate FinFET which can effectively improve carrier mobility and a method for manufacturing the same.

BACKGROUND

In the current sub-20 nm technology, 3D multi-gate devices (FinFETs or Tri-gate devices) are mainstream structures, which improve gate control capability and suppress current leakage and Short Channel Effects (SCEs).

Compared with, for example, conventional single-gate bulk Si or SOI MOSFETs, dual-gate SOI based MOSFETs can suppress the SCEs and the Drain Induced Barrier Lowering (DIBL) effect, have a lower junction capacitance, achieve a lightly-doped channel, adjust a threshold voltage by setting a work function of a metal gate, increase a driving current by a factor of about 2, and reduce the requirement on Equivalent Oxide Thickness (EOT). Compared with the dual-gate devices, the tri-gate devices have a gate surrounding the top surface and both side surfaces of the channel, thereby achieving more powerful gate control capability. Further, all-around nanowire multi-gate devices are more advantageous.

The existing method for manufacturing a FinFET structure comprises: etching a bulk Si or SOI substrate to form a plurality of fins and trenches extending in parallel along a first direction; filling the trenches with an insulating material to form Shallow Trench Isolation (STI); depositing a thin (only 1-5 nm, for example) dummy gate insulating layer (generally, silicon oxide) on top and sidewalls of the fins, and depositing a dummy gate layer (generally, polysilicon or amorphous silicon) on the dummy gate insulating layer; etching the dummy gate layer and the dummy gate insulating layer to form a dummy gate stack extending along a second direction which is preferably perpendicular to the first direction; forming a gate spacer at opposite sides of the dummy gate stack in the first direction by deposition and etching; etching portions of the fins at opposite sides of the gate spacer in the first direction to form source/drain trenches, and epitaxially growing source/drain regions in the source/drain trenches; depositing an Inter-Layer Dielectric (ILD) layer on the wafer; removing the dummy gate stack by etching and leaving a gate trench in the ILD layer; and depositing, in the gate trench, a gate insulating layer of a High-k (HK) material and a gate conductive layer of metal/metal alloy/metal nitride.

On the other hand, with scaling down of the devices, the driving capacity is greatly limited. A feasible solution is to use a material other than Si, for example, Ge, GaAs, InP, GaSb, InAs, InSb or the like. In these materials, carriers such as electrons or holes have mobility significantly greater than that in the Si material, so that the device driving capability increases significantly, which can effectively improve the device performances.

The films of a high mobility material as described above are generally thick bulk layers epitaxially formed on a Si substrate, or thick films which are selectively epitaxially formed on an Si substrate with an isolation structure such as STI or the like. The process of forming these layers of a high mobility material is difficult to be compatible with common CMOS standard processes, and has poor compatibility with the gate-last process of HK gate dielectric/Metal Gate (MG) which is currently the mainstream of the CMOS processes. In addition, the thick film layer with high mobility has problems such as too many defects, unstable performances, poor reliability and the like.

SUMMARY

In view of the above, the present disclosure aims to provide, among others, a novel FinFET structure and a method for manufacturing the same, to effectively improve the carrier mobility in a channel region of a fin while overcoming the above difficulties, thereby effectively improving performances and reliability of the device.

For this purpose, there is provided a method for manufacturing a semiconductor device, comprising: forming a fin extending along a first direction on a substrate; forming a dummy gate stack structure extending along a second direction on the fin; forming a gate spacer and source/drain regions at opposite sides of the dummy gate stack structure in the first direction; removing the dummy gate stack structure to form a gate trench; forming a surface layer on the top and/or sidewalls of the fin; and forming a gate stack structure in the gate trench.

The surface layer may comprise a high mobility material.

The high mobility material may comprises Ge, GaAs, InP, GaSb, InAs, InSb, SiGe, Si:C, SiGe:C, Strained-Si, GeSn, GeSiSn, or a combination thereof.

The surface layer may be in a multi-layer structure.

The step of forming a gate spacer and source/drain regions may further comprise: etching the fin with the gate spacer as a mask to form source/drain trenches; and epitaxially growing raised source/drain regions in the source/drain trenches.

The step of forming a surface layer may further comprise: etching the top and/or sidewalls of the fin to form a recess; and forming the surface layer in the recess by selective epitaxy.

After forming the surface layer, the method may further comprise forming an interface layer in the gate trench.

There is further provided a semiconductor device, comprising: a fin extending on a substrate along a first direction; a gate extending along a second direction across the fin; and source/drain regions and a gate spacer on the fin at opposite sides of the gate, wherein there is a surface layer on the top and/or sidewalls of the fin.

The surface layer may comprise a high mobility material, which may comprise Ge, GaAs, InP, GaSb, InAs, InSb, SiGe, Si:C, SiGe:C, Strained-Si, GeSn, GeSiSn, or a combination thereof.

The surface layer may be in a multi-layer structure.

According to the semiconductor device and the method for manufacturing the same of the present disclosure, a layer of a high mobility material is formed on the top and sidewalls of the fin by selective epitaxial grown, which effectively improves the carrier mobility in channel regions and effectively improves the performances and reliability of the device.

BRIEF DESCRIPTION OF THE DRAWINGS

The concept of the present disclosure will be described in detail by referring to the accompanying drawings, in which.

DETAILED DESCRIPTION

Features and effects of the concept of the present disclosure will be described in detail by referring to the accompanying drawings and in conjunction with embodiments, which disclose a 3D multi-gate FinFET and a method for manufacturing the same, by which it is possible to effectively improve carrier mobility of a channel region, thereby improving performances and reliability of the device. It should be noted that like reference signs refer to like structures. The terms such as "first," "second," "upper," "lower" and the like are used herein to illustrate respective device structures or manufacturing procedures. Unless particularly indicated, those terms do not imply the relationship of the device structures and manufacturing procedures in space, order or level.

It should be noted that part A of each figure is a sectional view along a direction perpendicular to a channel (or along a second direction), and part B of each figure is a sectional view along a direction parallel to the channel (or along a first direction).

Figure 1A:
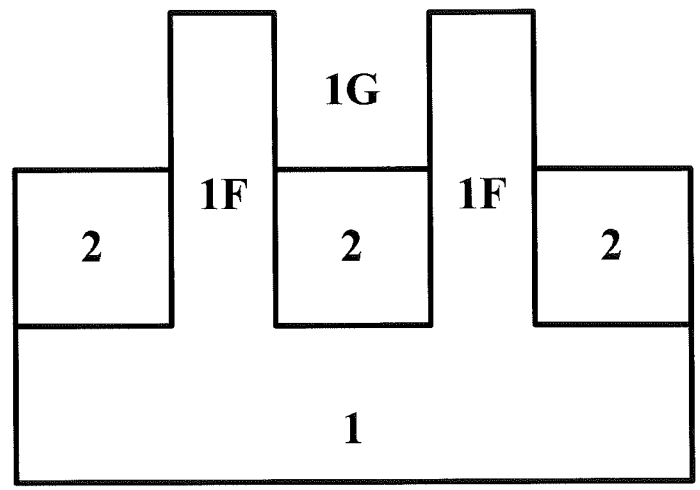
FIGS. 1 to 6 are sectional views showing some steps in a flow of manufacturing a FinFET according to an embodiment of the present disclosure.
Figure 1B:
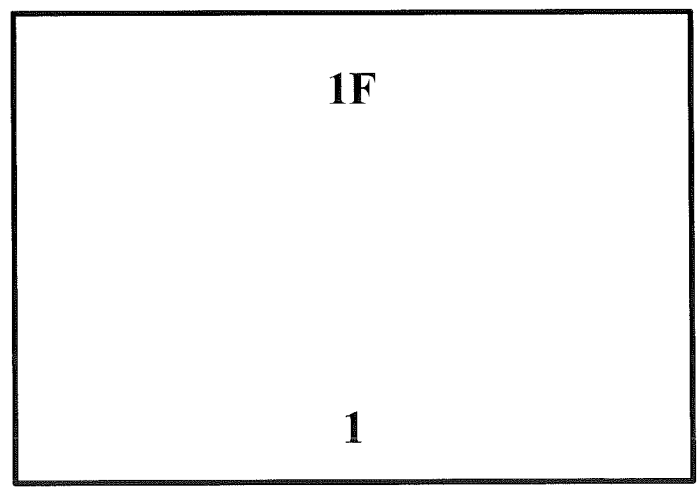

As shown in FIGS. 1A and 1B, a plurality of fin structures are formed along a first direction. Here, the first direction is an extending direction of a channel region of the device to be formed. A substrate 1 is provided. The substrate 1 may be appropriately selected according to the usage of the device, and may comprise monocrystal bulk silicon (Si), monocrystal bulk germanium (Ge), strained silicon (Strained Si), silicon germanium (SiGe), a compound semiconductor material such as Gallium Nitride (GaN), Gallium Arsenide (GaAs), Indium Phosphide (InP), and Indium Antimonide (InSb), or a carbon-based semiconductor such as Graphene, SiC, and Carbon nanotube, or the like. In consideration of the compatibility with CMOS processes, the substrate 1 is preferably bulk silicon. The substrate 1 is subjected to photolithography/etching, so as to form, in the substrate 1, a plurality of trenches 1G extending in parallel along the first direction and also fins 1F composed of remaining portions of the substrate 1 between the respective trenches 1G. The trench 1G has a depth-width ratio preferably larger than 5:1. An insulating isolation dielectric layer of a material such as silicon oxide, silicon oxynitride, silicon hydroxide, organics or the like is filled into the trenches 1G between the respective fins 1F by deposition through a process such as PECVD, HDPCVD, rapid thermal oxidation (RTO), spin coating, FlowCVD or the like, so as to form STI 2.

Figure 2A:
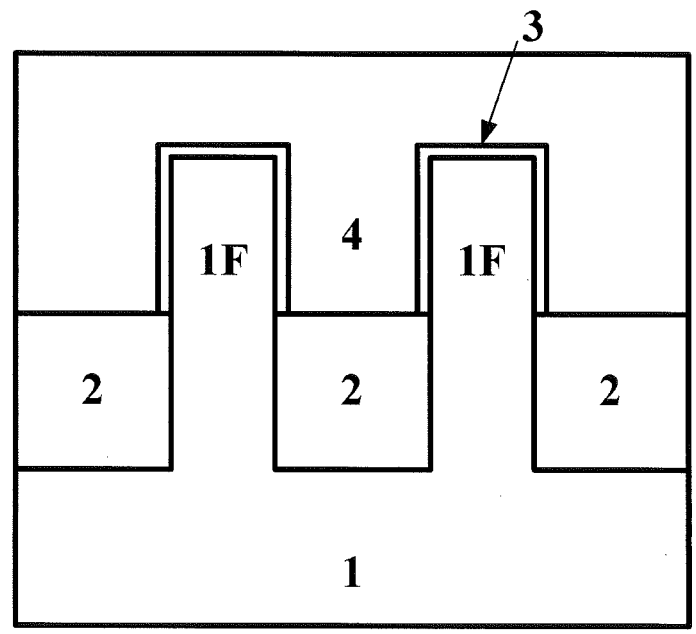
Figure 2B:
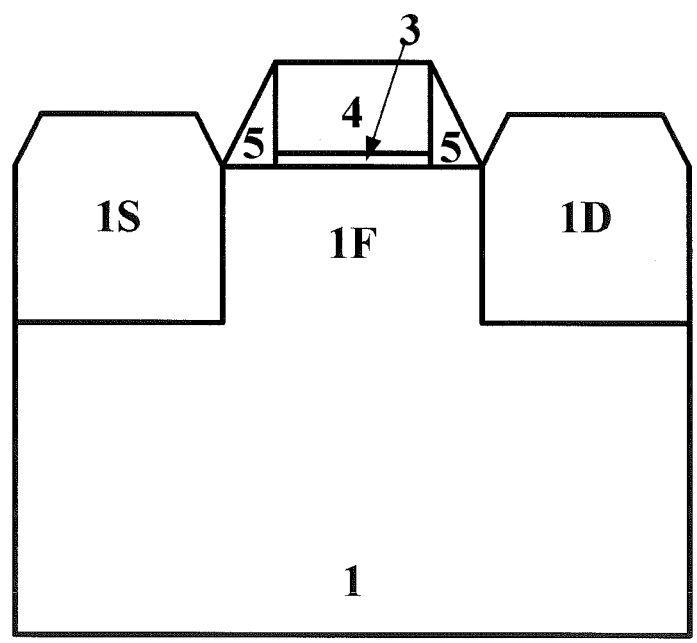

As shown in FIGS. 2A and 2B, a dummy gate stack structure 3/4 and a gate spacer 5 are formed on the fins 1F, and source/drain regions 1S/1D are formed at opposite sides of the gate spacer 5.

A dummy gate insulating layer 3 and a dummy gate layer 4 are deposited on the wafer substrate. The dummy gate insulating layer 3 and the dummy gate layer 4 are deposited in sequence on the substrate 1 by a conventional method such as LPCVD, PECVD, HDPCVD, RTO, MBE, ALD, MOCVD, evaporation, sputtering or the like, so that the dummy gate insulating layer 3 covers the top of the STI 2 and the top and sidewalls of the fins 1F, and the dummy gate layer 4 covers the dummy gate insulating layer 3. The dummy gate insulating layer 3 has a thickness of about 1-5 nm for example, and preferably 1-3 nm, and comprises a material such as silicon oxide. The dummy gate layer 4 comprises a material such as polysilicon, amorphous silicon, amorphous germanium, amorphous carbon, SiGe, Si:C or a combination thereof, and has a thickness of about 20-500 nm for example. In addition, the thicknesses of the various layers described above may not be drawn to scale, and may be appropriately set according to specific requirements on the device size and electrical performances.

Then, the dummy gate layer 4 is planarized to eliminate protrusions on the top of the fins 1F, so as to avoid distortion of lines in subsequent etching processes. For example, the dummy gate layer 4 is planarized by Chemical Mechanical Polishing (CMP) or etching-back to eliminate the protrusions on the top of the fins 1F.

Then, the dummy gate layer 4 and the dummy gate insulating layer 3 are patterned to form a dummy gate stack. A soft mask may be formed by coating photoresist on the dummy gate layer 4, or a hard mask of a material such as silicon nitride may be formed by deposition and etching (not shown). The dummy gate layer 4 and the dummy gate insulating layer 3 are etched with the soft/hard mask as a mask, to form the dummy gate stack 4/3 extending along a second direction. The etching may comprise wet etching, for example, with TMAH for the dummy gate layer 4 of silicon, and diluted Buffer Oxide Etchant (dBOE) or diluted Hydrofluoric Acid (dHF) for the dummy gate insulating layer 3 of silicon oxide. The etching may also comprise dry etching, for example, plasma etching, Reactive Ion Etching (RIE), with etching gas such as CF-based gas or Cl-based gas, and optionally with oxidization gas such as oxygen and inert gas added to adjust an etching rate.

Then, a gate spacer 5 is formed at opposite sides of the dummy gate stack 4/3 in the first direction. The gate spacer 5 is formed on the dummy gate stack by depositing a material layer such as silicon nitride, amorphous carbon, DLC or a combination thereof using a method such as LPCVD, PECVD, HDPCVD, MOCVD, MBE, ALD or the like and then etching it by wet etching or dry etching. In an embodiment of the present disclosure, the etching is carried out by RIE.

Then, the fins 1F are etched with the gate spacer 5 as a mask to form source/drain trenches, and raised source/drain regions 1S and 1D are formed in the source/drain trenches by epitaxy. In an embodiment of the present disclosure, the fins 1F are etched downward along opposite sides of the gate spacer 5 by an anisotropic etching method, until an interface between the fins 1F and the substrate 1, i.e., the top of STI 2, is reached, to form source/drain grooves (not shown) with substantially vertical sidewalls. In other embodiments of the present disclosure, the vertical sidewalls of the source/drain grooves may be further etched laterally by an isotropic etching method, to form source/drain grooves at the sides of and also under upper parts of the fins 1F, which are recessed towards a channel region, and preferably are in communication with each other so that the upper parts of the fins 1F are separated from the substrate 1 partially or completely, thereby providing good insulated isolation. The laterally recessed source/drain grooves may have a cross section in a shape of Σ (comprised of multiple polygonal lines), trapezoid, inverted trapezoid, triangle, D (a half of a curved surface, for example a spherical surface, an ellipsoid surface, a hyperboloid, a saddle surface or the like), C (a majority of a curved surface which is larger than a half of the curved surface, for example a spherical surface, an ellipsoid surface, a hyperboloid, a saddle surface or the like), a rectangle or the like. In the vertical or laterally recessed source/drain grooves formed as above, embedded source/drain regions 1S and 1D are epitaxially grown by an epitaxial growth process such as UHVCVD, MOCVD, ALD, MBE, normal pressure epitaxy or the like. Channel regions are created on the upper parts of the fins 1F between the source/drain regions 1S/1D (in the first direction). For PMOS, the source/drain regions 1S/1D may comprise SiGe, SiSn, GeSn, Si, or a combination thereof, so as to apply compressive stress to the channel regions, thereby improving hole mobility; and for NMOS, the source/drain regions 1S/1D may comprise Si:C, Si:H, SiGe:C, Si, or a combination thereof, so as to apply tensile stress to the channel regions, thereby improving electron mobility. As shown in FIG. 2B, the top of the source/drain regions 1S/1D is higher than the channel regions of the fins 1F (resulting in raised source/drain regions, which can effectively reduce a contact resistance) and is lower than the top of the dummy gate layer 4. This configuration is merely for the purpose of illustration, and therefore, the difference in height between the top surfaces may be set arbitrarily. Preferably, the source/drain regions may be doped in-situ while being epitaxially grown, to change the conduction type and concentration of the source/drain regions. In addition, ion implantation may be performed in the source/drain regions after epitaxial growth. The doping method comprises ion implantation, multi-angle ion implantation, plasma doping, doping by molecular or atomic layer deposition or the like after epitaxial growth. The doping depth may comprise surface doping with the source/drain regions and the fins being covered or body doping. The conduction type of the source/drain regions is adjusted according to the MOSFET type. For example, doping is performed with P, As, Sb, or the like for NMOS, and with B, Al, Ga, In, or the like for PMOS. Then, annealing may be performed to activate the various dopants as described above. Preferably, metal silicide is formed on the top of the source/drain regions to reduce source/drain contact resistance.

Figure 3A:
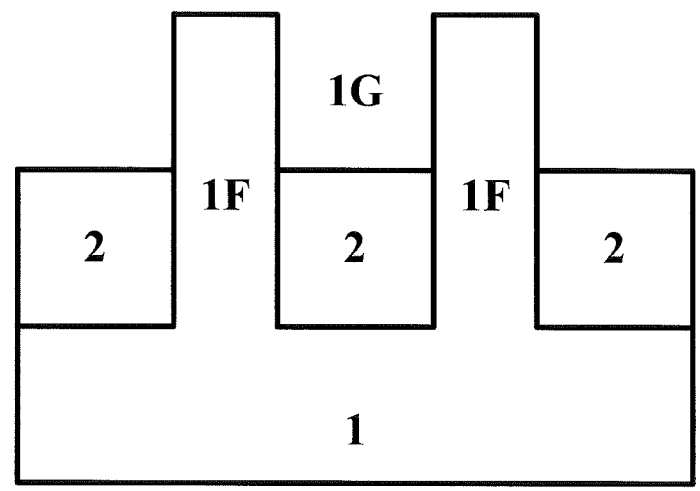
Figure 3B:
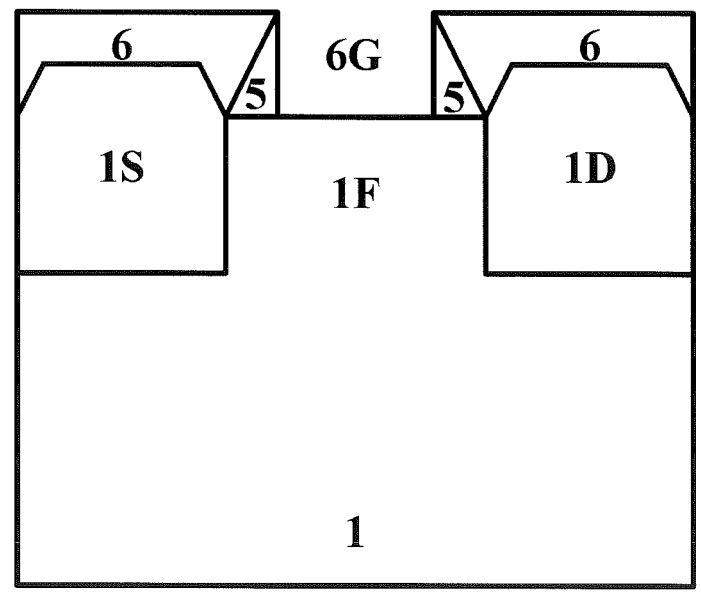

As shown in FIGS. 3A and 3B, an Inter-Layer Dielectric (ILD) layer 6 and a gate trench 6G are formed on the wafer substrate. The ILD 6 may comprise a material of, for example, silicon oxide, silicon oxynitride, or a low-k material. The low-k material includes, but not limited to, an organic low-k material (for example, an organic polymer containing aryl group or polycyclic group), an inorganic low-k material (for example, an amorphous carbon nitride film, a polycrystalline boron nitride film, silicon fluoride glass, BSG, PSG, or BPSG), a porous low-k material (for example, a silsesquioxane (SSQ) based porous low-k material, porous silicon dioxide, porous SiOCH, C-doped silicon dioxide, porous F-doped amorphous carbon, porous diamond, or porous organic polymer). The ILD 6 is formed by a process such as spin coating, spray coating, screen printing, CVD deposition or the like.

The dummy gate stack 4/3 is removed by etching, to leave the gate trench 6G in the ILD 6. The etching may comprise wet etching, for example, with TMAH for the dummy gate layer 4 of silicon, and dBOE or dHF for the dummy gate insulating layer 3 of silicon oxide. The etching may also comprise dry etching, for example, plasma etching, or RIE, with etching gas such as CF-based gas or Cl-based gas, and optionally with oxidization gas such as oxygen and inert gas added to adjust an etching rate.

Figure 4A:
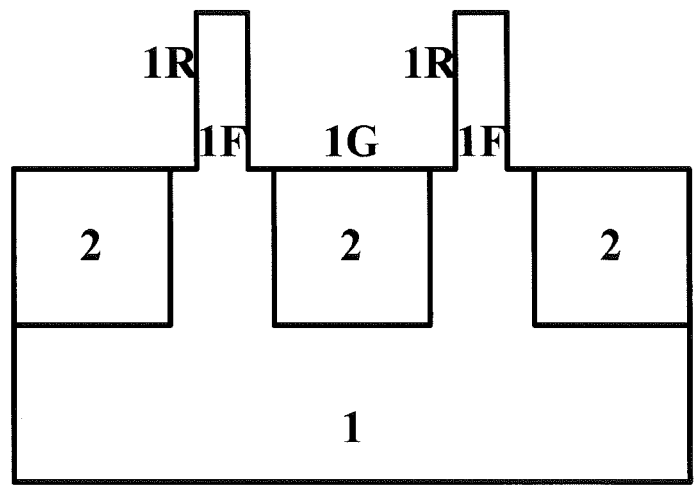
Figure 4B:
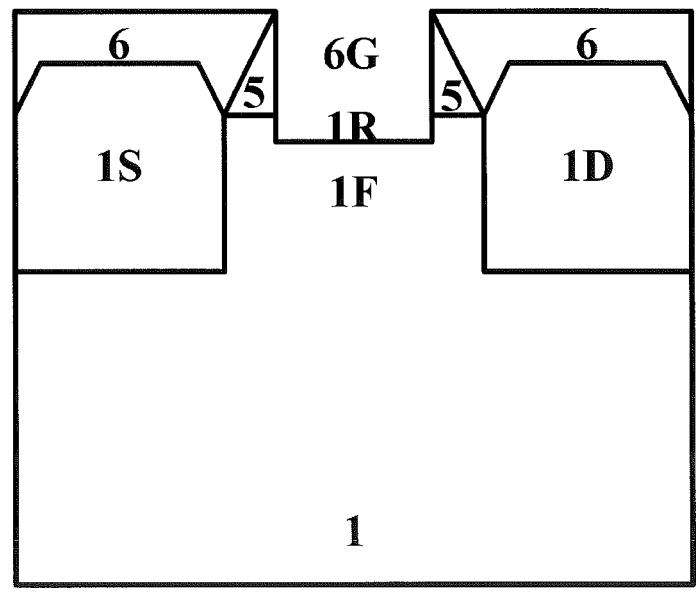

As shown in FIGS. 4A and 4B, the surface of the fins 1F is etched to form a recess 1R on the top and sidewalls of the fins 1F. Wet etching or dry etching may be selected according to the material of the fins 1F. For the fins 1F of silicon, wet etching may be performed with TMAH or KOH, and the temperature and concentration are adjusted, to achieve substantially isotropic etching. Alternatively, plasma dry etching using CF-based gas or Cl-based gas may be used, and the ratio of the respective etching gas is adjusted to achieve substantially isotropic etching. A depth (or, width or thickness) of the recess 1R is preferably less than ¼ of the thickness of the fins 1F themselves (or, the width along a horizontal direction, i.e., the first direction) and preferably greater than ⅒ of the thickness of the fins 1F themselves.

Figure 5A:
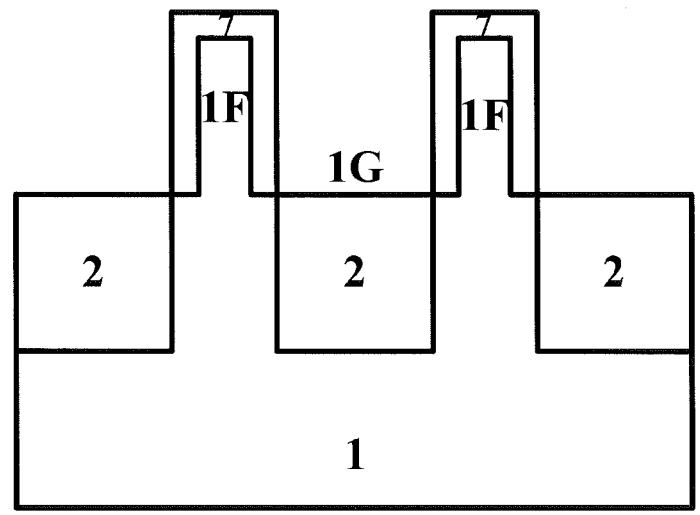
Figure 5B:
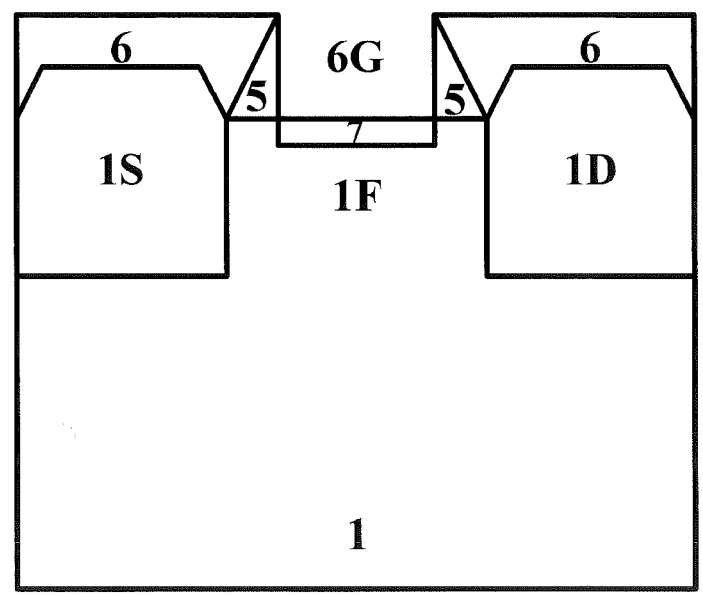

As shown in FIGS. 5A and 5B, selective epitaxial growth is performed in the recess 1R of the fins 1F, to form a surface layer 7 made of a high mobility material. The material of the surface layer 7 has high mobility, such as Ge, GaAs, InP, GaSb, InAs, InSb, SiGe, Si:C, SiGe:C, Strained-Si, GeSn, GeSiSn, or a combination thereof. Although the layer 7 is shown as a single layer in the figure, in practice, multiple layers of high mobility may be deposited according to requirements of lattice matching, for example, Si—SiGe—SiGe:C, Si—SiGe—GaAs—InAs, Si—SiGe—GeSn or the like. It should be noted that the material of the surface layer 7 is not limited to the above specific examples, and the concept of the present disclosure can be implemented to achieve the expected effects, as long as the carrier mobility in the surface layer 7 is greater than that in the (Si) material of the fins 1F. The surface layer 7 may be formed by a method such as PECVD, HDPCVD, MOCVD, UHCVD, MBE, ALD, or the like. The surface layer 7 has a thickness to fill the surface recess 1R of the fins 1F to form a substantially planar surface, that is, a sum of the thicknesses (or, widths) of the remaining fin 1F and the surface layer 7 is equal to the thickness (or, width) of the original fin 1F as shown in FIG. 1. Preferably, after the surface layer 7 is formed, an extremely thin interface layer (not shown) made of oxide is created by a chemical oxidation method (for example, immersing it in deionized water containing 10 ppm ozone for 20 s), so as to reduce interfacial defects between the channel region (the surface layer 7 and the upper portion of the fins 1F beneath the surface layer 7) and a gate insulting layer of an HK material to be formed.

It should be noted that in FIGS. 4 and 5, the surface layer is formed by firstly forming a recess by etching and then performing deposition, merely for purpose of maintaining the size of the fins small. In practice, the surface layer may be formed by deposition directly on the top and sidewalls of the fins, but without forming a recess by etching, which slightly increases the line width of the device.

Figure 6A:
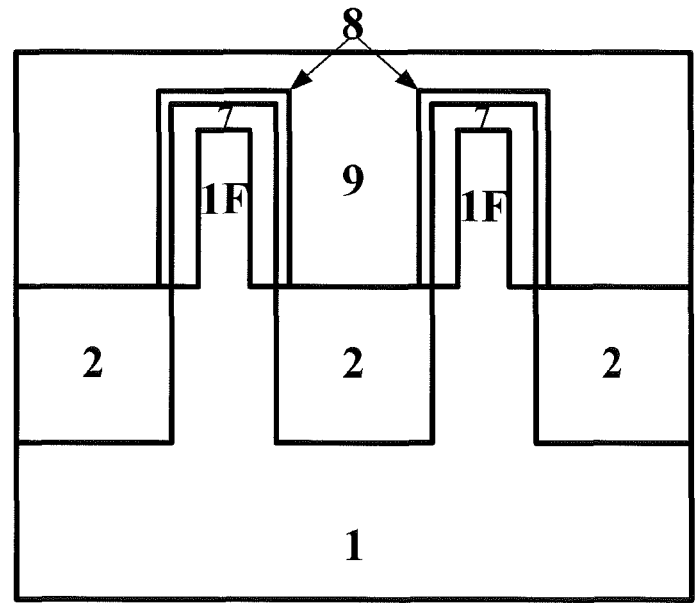
Figure 6B:
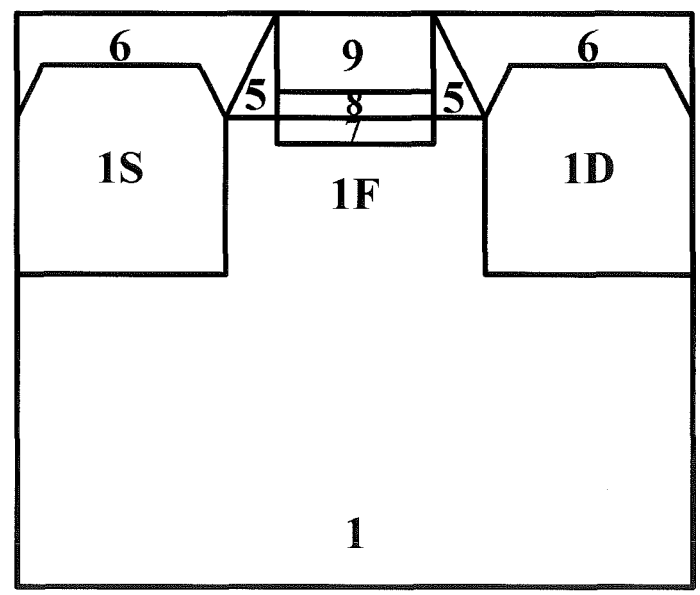

As shown in FIGS. 6A and 6B, a gate stack is formed in the gate trench. A gate insulating layer 8 of an HK material and a gate conductive layer 9 of a metal/metal alloy/metal nitride material are deposited in sequence in the gate trench, to form a gate stack structure. Then, the device may be completed by the existing processes, including for example: planarizing the gate stack structure by CMP until the ILD 6 is exposed; and etching source/drain contact holes (not shown) in the ILD 6 to reach the source/drain regions 1S/1D, and depositing a barrier layer of metal nitride and a conductive layer of a metal material in the source/drain contact holes, to form source/drain contact plugs (not shown).

The resultant device is shown in the cross-sectional view of FIGS. 6A and 6B, and comprises: a plurality of fins extending on a substrate along a first direction; a gate extending across each of the fins along a second direction (crossing, and preferably, being perpendicular to the first direction); and source/drain regions and a gate spacer on the fins at opposite sides of the gate, wherein there is a surface layer of a high mobility material on the top and/or sidewalls in the second direction of the fins. Materials and geometries of those structures have been set forth in detail in the description of the method, and will be omitted here.

According to the semiconductor device and the method for manufacturing the same of the present disclosure, a layer of a high mobility material is formed on the top and sidewalls of the fins by selective epitaxial grown, which effectively improves the carrier mobility in the channel regions and effectively improves the performances and reliability of the device.

The present disclosure has been described above with reference to one or more example embodiments. It should be understood that various suitable alternations and equivalents can be made to the device structure by one skilled person in the art without departing from the spirits and scope of the present disclosure. Moreover, given the teachings of the present disclosure, there may be various modifications to be adapted for particular situations or materials without departing from the spirits and scope of the present disclosure. Therefore, the present disclosure is not intended to limit the present disclosure by the above particular embodiments. Instead, the device structure and the manufacture method thereof as disclosed should include all embodiments falling within the scope of the present disclosure.

We claim:

1. A semiconductor device, comprising:
   a fin extending on a substrate along a first direction;
   shallow trench isolation regions on the substrate on both sides of a lower portion of the fin extending along the first direction, wherein the top of the fin extends above the top of the shallow trench isolation regions forming an upper portion of the fin;
   a gate extending along a second direction across the fin; and
   source/drain regions and a gate spacer on the fin at opposite sides of the gate,
   wherein the upper portion of the fin has a smaller thickness along the second direction than the lower portion of the fin; and
   wherein the fin has a recess on the top where the fin intersects the gate and there is a surface layer in the recess of the fin and on both sidewalls of the upper portion of the fin.

2. The semiconductor device according to claim 1, wherein the surface layer comprises a high mobility material, which comprises Ge, GaAs, InP, GaSb, InAs, InSb, Site, Si:C, SiGe:C, Strained-Si, GeSn, GeSiSn, or a combination thereof.

3. The semiconductor device according to claim 1, wherein the surface layer is in a multi-layer structure.

4. The semiconductor device according to claim 1, wherein the surface layer has a thickness that fills the recess of the fin to form a substantially planar surface.

5. The semiconductor device according to claim 1, wherein the depth of the recess is less than ¼ of the thickness of the fin and greater than ¹⁄₁₀ of the thickness of the fin.

6. A semiconductor device, comprising:
   a plurality of fins extending on a substrate along a first direction;
   a gate extending along a second direction across each of the fins; and
   source/drain regions and a gate spacer on the fins at opposite sides of the gate,
   wherein the fins have a recess on the top and/or sidewalls where the fins intersect the gate, and there is a surface layer in the recess of the fins.

7. The semiconductor device according to claim 6, wherein the surface layer comprises a high mobility material, which comprises Ge, GaAs, InP, GaSb, InAs, InSb, Site, Si:C, SiGe:C, Strained-Si, GeSn, GeSiSn, or a combination thereof.

8. The semiconductor device according to claim 6, wherein the surface layer is in a multi-layer structure.

9. The semiconductor device according to claim 6, wherein the depth of the recess is less than ¼ of the thickness of the fins and greater than ¹⁄₁₀ of the thickness of the fins.

10. The semiconductor device according to claim 6, wherein the surface layer has a thickness that fills the recess of the fins to form a substantially planar surface.

11. A semiconductor device, comprising:
    a plurality of fins extending on a substrate along a first direction;
    a gate extending along a second direction across each of the fins; and
    source/drain regions and a gate spacer on the fins at opposite sides of the gate,
    wherein the fins have a recess on the top where the fins intersect the gate, and there is a surface layer in the recess on the top of the fins, and the top of the fins is higher than Shallow Trench Isolation (STI) on the substrate.

12. The semiconductor device according to claim 11, wherein the surface layer comprises a high mobility material, which comprises Ge, GaAs, InP, GaSb, InAs, InSb, SiGe, Si:C, SiGe:C, Strained-Si, GeSn, GeSiSn, or a combination thereof.

13. The semiconductor device according to claim 11, wherein the surface layer is in a multi-layer structure.

14. The semiconductor device according to claim 11, wherein the surface layer has a thickness that fills the recess of the fins to form a substantially planar surface.

15. The semiconductor device according to claim 11, wherein the depth of the recess is less than ¼ of the thickness of the fins and greater than ¹⁄₁₀ of the thickness of the fins.

* * * * *